(12) United States Patent
Mandal

(10) Patent No.: US 8,008,968 B2
(45) Date of Patent: Aug. 30, 2011

(54) MULTIPATH AMPLIFIER

(75) Inventor: Dipankar Mandal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/694,028

(22) Filed: Jan. 26, 2010

(65) Prior Publication Data

US 2011/0133970 A1 Jun. 9, 2011

(30) Foreign Application Priority Data

Dec. 3, 2009 (IN) .......................... 2979/CHE/2009

(51) Int. Cl.
 *H03F 1/02* (2006.01)
(52) U.S. Cl. ............................................ 330/9; 330/297
(58) Field of Classification Search .......... 341/155–165; 330/9, 227, 124 R, 310, 150, 259, 261, 254, 330/136, 129, 51, 107, 69, 302, 306
See application file for complete search history.

(56) References Cited

U.S. PATENT DOCUMENTS

| | | | | |
|---|---|---|---|---|
| 4,559,502 A * | 12/1985 | Hiujsing | ........................ | 330/297 |
| 5,485,121 A * | 1/1996 | Huijsing et al. | ............... | 330/260 |
| 6,275,104 B1 | 8/2001 | Holter | | |
| 6,486,820 B1 | 11/2002 | Allworth et al. | | |
| 6,566,942 B2 * | 5/2003 | Shigenobu | ........................ | 330/9 |
| 6,577,185 B1 | 6/2003 | Chandler et al. | | |
| 6,611,163 B1 * | 8/2003 | Mukherjee et al. | ........... | 327/337 |
| 6,823,003 B2 * | 11/2004 | Laureanti | ........................ | 375/219 |
| 7,193,545 B2 | 3/2007 | Morrow et al. | | |
| 7,227,481 B2 | 6/2007 | del Mar Chamarro Marti et al. | | |
| 7,259,709 B2 * | 8/2007 | Ogita et al. | ................... | 341/172 |
| 7,342,449 B2 | 3/2008 | Ishii et al. | | |
| 7,459,967 B2 * | 12/2008 | Tsuchi et al. | ..................... | 330/9 |
| 7,498,878 B2 * | 3/2009 | Lim | ........................ | 330/124 R |
| 7,733,169 B2 * | 6/2010 | Zhang et al. | ..................... | 330/9 |
| 7,852,151 B2 * | 12/2010 | Bardsley et al. | ................. | 330/51 |
| 7,880,541 B1 * | 2/2011 | Golden | ........................ | 330/69 |

* cited by examiner

*Primary Examiner* — Lam T Mai

(74) *Attorney, Agent, or Firm* — John J. Patti; Wade J. Brady, III; Frederick J. Telecky

(57) ABSTRACT

Because of variations in open loop gain and bandwidth in successive approximate register (SAR) analog-to-digital converters (ADCs), designing amplifiers with the desired characteristics is difficult. Here, a multipath amplifier is provided that accounts for the variations in open loop gain and bandwidth. Preferably, a number of cascaded amplifiers are provided that can auto-zero to account for offset voltages so as to allow the multipath amplifier to be stable over the desired open loop gains and bandwidths.

17 Claims, 3 Drawing Sheets

MULTIPATH AMPLIFIER

CROSS-RELATED APPLICATIONS

This application claims priority from Indian Patent Application No. 2979/CHE/2009, filed Dec. 3, 2009, which is hereby incorporated by reference for all purposes.

TECHNICAL FIELD

The invention relates generally to an amplifier and, more particularly, to a multipath amplifier that is preferably used with a recyclic successive approximation register (SAR) analog-to-digital converter (ADC).

BACKGROUND

In a recyclic SAR ADC, the open loop gain can change from $2^4$ to $2^{12}$, and bandwidth requirements can also change from cycle to cycle. Thus, it is difficult to provide an amplifier that is stable with such variations in both gain and bandwidth. Some examples of conventional circuit are: U.S. Pat. Nos. 6,275,104; 6,486,820; 6,577,185; 7,193,545; 7,227,481; 7,342,449.

SUMMARY

A preferred embodiment of the present invention, accordingly, provides an apparatus is provided. The apparatus comprises a first amplifier stage including: a first preamplifier having a plurality of input terminals and an output terminal, wherein at least one of the input terminals of the first preamplifier receives an input signal for the first amplifier stage; a first output amplifier having an input terminal and an output terminal, wherein the input terminal of the first output amplifier is coupled to the output terminal of the first preamplifier; a first switch that is coupled between the output terminal of the first output amplifier and at least one of the input terminals of the first preamplifier; and a first capacitor that is coupled to the first switch; and a second amplifier stage including: a second preamplifier having a plurality of input terminals and an output terminal, wherein at least one of the input terminals is coupled the output terminal of the first preamplifier stage; a second output amplifier having an input terminal and an output terminal, wherein the input terminal of the second output amplifier is coupled to the output terminal of the second preamplifier; a second switch that is coupled between the output terminal of the second output amplifier and at least one of the input terminals of the second preamplifier; and a second capacitor that is coupled to the second switch.

In accordance with a preferred embodiment of the present invention, the apparatus further comprises a third stage including: a third preamplifier having a plurality of input terminals and an output terminal, wherein at least one of the input terminals is coupled the output terminal of the second preamplifier stage; a third output amplifier having an input terminal and an output terminal, wherein the input terminal of the third output amplifier is coupled to the output terminal of the third preamplifier; a third switch that is coupled between the output terminal of the third output amplifier and at least one of the input terminals of the third preamplifier; and a third capacitor that is coupled to the third switch.

In accordance with a preferred embodiment of the present invention, the first preamplifier further comprises a pair of amplifiers, wherein each amplifier from the pair includes a pair of differential input terminals and a pair of differential output terminals.

In accordance with a preferred embodiment of the present invention, the second preamplifier further comprises a pair of amplifiers, wherein each amplifier from the pair includes a pair of differential input terminals and a pair of differential output terminals.

In accordance with a preferred embodiment of the present invention, each of the first and second output terminals includes a pair of differential input terminals and a pair of differential output terminals.

In accordance with a preferred embodiment of the present invention, an apparatus is provided. The apparatus comprises a first amplifier having a first input terminal, a second input terminal, a first output terminal, and a second output terminal, wherein the first and second input terminals of the first amplifier receive an input signal; a second amplifier having a first input terminal, a second input terminal, a first output terminal, and a second output terminal, wherein the first output terminal of the second amplifier is coupled to the first output terminal of the first amplifier, and wherein the second output terminal of the second amplifier is coupled to the second output terminal of the first amplifier; a third amplifier having a first input terminal, a second input terminal, a first output terminal, and a second output terminal, wherein the first input terminal of the third amplifier is coupled to the first output terminal of the first amplifier, and wherein the second input terminal of the third amplifier is coupled to the second output terminal of the first amplifier; a first switch that is coupled between the first output terminal of the third amplifier and the first input terminal of the second amplifier; a second switch that is coupled between the second output terminal of the third amplifier and the second input terminal of the second amplifier; a fourth amplifier having a first input terminal, a second input terminal, a first output terminal, and a second output terminal, wherein the first input terminal of the fourth amplifier is coupled to the first output terminal of the first amplifier, and the second input terminal of the fourth amplifier is coupled to the second output terminal of the first amplifier; a fifth amplifier having a first input terminal, a second input terminal, a first output terminal, and a second output terminal, wherein first output terminal of the fifth amplifier is coupled to the first output terminal of the fourth amplifier, and wherein the second output terminal of the fifth amplifier is coupled to the second output terminal of fourth amplifier; a sixth amplifier having a first input terminal, a second input terminal, a first output terminal, and a second output terminal, wherein the first input terminal of the sixth amplifier is coupled to the first output terminal of the fourth amplifier, and wherein the second input terminal of the sixth amplifier is coupled to the second output terminal of the fourth amplifier; a third switch that is coupled between the first output terminal of the sixth amplifier and the first input terminal of the fifth amplifier; and a fourth switch that is coupled between the second output terminal of the and the second input terminal of the fifth amplifier.

In accordance with a preferred embodiment of the present invention, the apparatus further comprises: a seventh amplifier having a first input terminal, a second input terminal, a first output terminal, and a second output terminal, wherein the first input terminal of the seventh amplifier is coupled to the first output terminal of the first amplifier, and the second input terminal of the seventh amplifier is coupled to the second output terminal of the first amplifier; a eighth amplifier having a first input terminal, a second input terminal, a first output terminal, and a second output terminal, wherein first output terminal of the eighth amplifier is coupled to the first output terminal of the seventh amplifier, and wherein the second output terminal of the eighth amplifier is coupled to the second output terminal of seventh amplifier; a ninth amplifier having a first input terminal, a second input terminal, a first output terminal, and a second output terminal, wherein the first input terminal of the ninth amplifier is coupled to the first output terminal of the seventh amplifier, and wherein the second input terminal of the ninth amplifier is coupled to the second output terminal of the seventh amplifier; a fifth switch that is coupled between the first output terminal of the ninth amplifier and the first input terminal of the eighth amplifier; and a sixth switch that is coupled between the second output terminal of the and the second input terminal of the eighth amplifier.

In accordance with a preferred embodiment of the present invention, the apparatus further comprises a fifth switch that is coupled between the first and second input terminals of the first amplifier.

In accordance with a preferred embodiment of the present invention, the apparatus further comprises: a first capacitor that is coupled between the first input terminal of the second amplifier and ground; a second capacitor that is coupled between the second input terminal of the second amplifier and ground; a third capacitor that is coupled between the first input terminal of the fifth amplifier and ground; and a fourth capacitor that is coupled between the second input terminal of the fifth amplifier and ground.

In accordance with a preferred embodiment of the present invention, an successive approximate register (SAR) analog-to-digital converter (ADC) is provided. The SAR ADC comprises an ADC; a DAC that is coupled to the ADC; a residue amplifier including: a first preamplifier having a plurality of input terminals and an output terminal, wherein at least one of the input terminals of the first preamplifier is coupled to the DAC; a first output amplifier having an input terminal and an output terminal, wherein the input terminal of the first output amplifier is coupled to the output terminal of the first preamplifier; a first switch that is coupled between the output terminal of the first output amplifier and at least one of the input terminals of the first preamplifier; and a first capacitor that is coupled to the first switch; and a second preamplifier having a plurality of input terminals and an output terminal, wherein at least one of the input terminals is coupled the output terminal of the first preamplifier stage; a second output amplifier having an input terminal and an output terminal, wherein the input terminal of the second output amplifier is coupled to the output terminal of the second preamplifier; a second switch that is coupled between the output terminal of the second output amplifier and at least one of the input terminals of the second preamplifier; and a second capacitor that is coupled to the second switch; and SAR logic that is coupled to the residue amplifier and to the DAC.

In accordance with a preferred embodiment of the present invention, the SAR ADC further comprises a conversion flash circuit coupled between the residue amplifier and the SAR logic.

In accordance with a preferred embodiment of the present invention, the residue amplifier further comprises: a third preamplifier having a plurality of input terminals and an output terminal, wherein at least one of the input terminals is coupled the output terminal of the second preamplifier stage; a third output amplifier having an input terminal and an output terminal, wherein the input terminal of the third output amplifier is coupled to the output terminal of the third preamplifier; a third switch that is coupled between the output terminal of the third output amplifier and at least one of the input terminals of the third preamplifier; and a third capacitor that is coupled to the third switch.

In accordance with a preferred embodiment of the present invention, each of the first and second output amplifier further comprises a first input terminal, a second input terminal, a first output terminal, and a second output terminal, and wherein the first switch further comprises a pair of first switches, and wherein the second switch further comprises a pair of second switches, and wherein the first capacitor further comprises a pair of first capacitors, and wherein the second capacitor further comprises a pair of second capacitors.

In accordance with a preferred embodiment of the present invention, the first preamplifier further comprises: a first amplifier having a first input terminal, a second input terminal, a first output terminal, and a second output terminal, wherein the first and second input terminals of the first amplifier receive an input signal; and a second amplifier having a first input terminal, a second input terminal, a first output terminal, and a second output terminal, wherein the first output terminal of the second amplifier is coupled to the first output terminal of the first amplifier, and wherein the second output terminal of the second amplifier is coupled to the second output terminal of the first amplifier, and wherein each of the first and second input terminals of the second amplifier is coupled to at least one of the pair of first switches.

In accordance with a preferred embodiment of the present invention, the second preamplifier further comprises: a third amplifier having a first input terminal, a second input terminal, a first output terminal, and a second output terminal, wherein the first input terminal of the third amplifier is coupled to the first output terminal of the first amplifier, and the second input terminal of the third amplifier is coupled to the second output terminal of the first amplifier; and a fourth amplifier having a first input terminal, a second input terminal, a first output terminal, and a second output terminal, wherein first output terminal of the fourth amplifier is coupled to the first output terminal of the third amplifier, and wherein the second output terminal of the fourth amplifier is coupled to the second output terminal of third amplifier, and wherein each of the first and second input terminals of the fourth amplifier is coupled to at least one of the pair of second switches.

In accordance with a preferred embodiment of the present invention, the DAC further comprises: a set of resolution capacitors, wherein each resolution capacitor from the first set of resolution capacitors is coupled to first preamplifier; a set of resolution switches, wherein each resolution switch is coupled to the ADC, receives a reference voltage, and is coupled to at least one of the resolution capacitors; a set of feedback capacitors, wherein each feedback capacitor is coupled to the first preamplifier; a set of feedback switches, wherein each feedback switch is coupled to the residue amplifier, receives a common mode voltage, and is coupled to at least one of the feedback capacitors.

In accordance with a preferred embodiment of the present invention, the SAR ADC further comprises a sample flash circuit that is coupled between the ADC and SAR logic.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
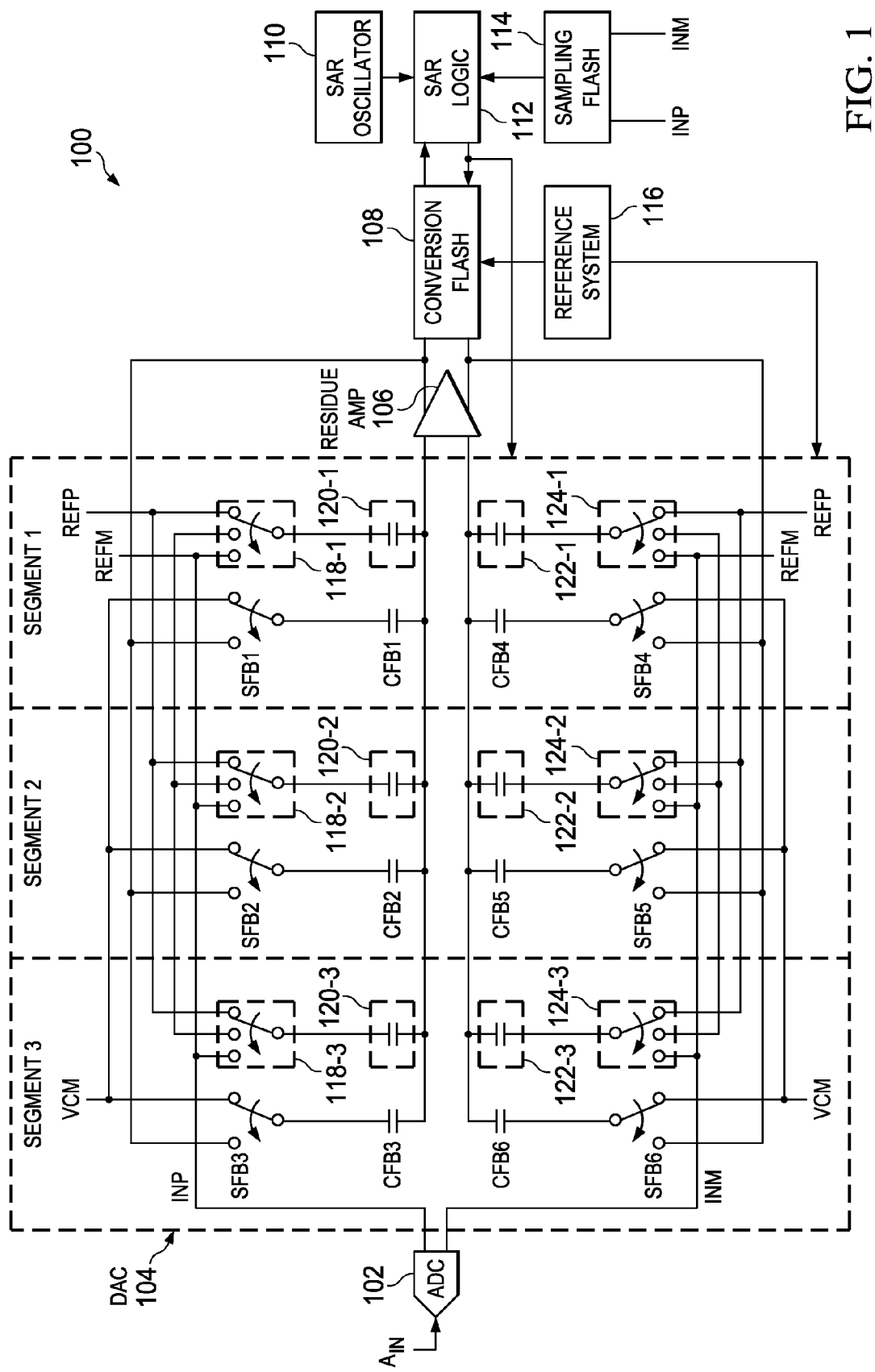
FIG. 1 is a block diagram of an example of ADC in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates an ADC in accordance with a preferred embodiment of the present invention. The ADC 100 generally comprises ADC 102, digital-to-analog converter (DAC) 104, residue amplifier 106, conversion flash 108, SAR oscillator 110, SAR logic 112, sampling flash 114, and reference system 116. DAC 104 generally comprises capacitor arrays 120-1, 120-2, 120-3, 122-1, 122-2, and 122-3 (which each include several resolution capacitors), switch arrays 118-1, 118-2, 118-3, 124-1, 124-2, and 124-3 (which each include several resolution switches), feedback capacitors CFB1 through CFB6, and feedback switches SFB1 through SFB6.

Figure 3:
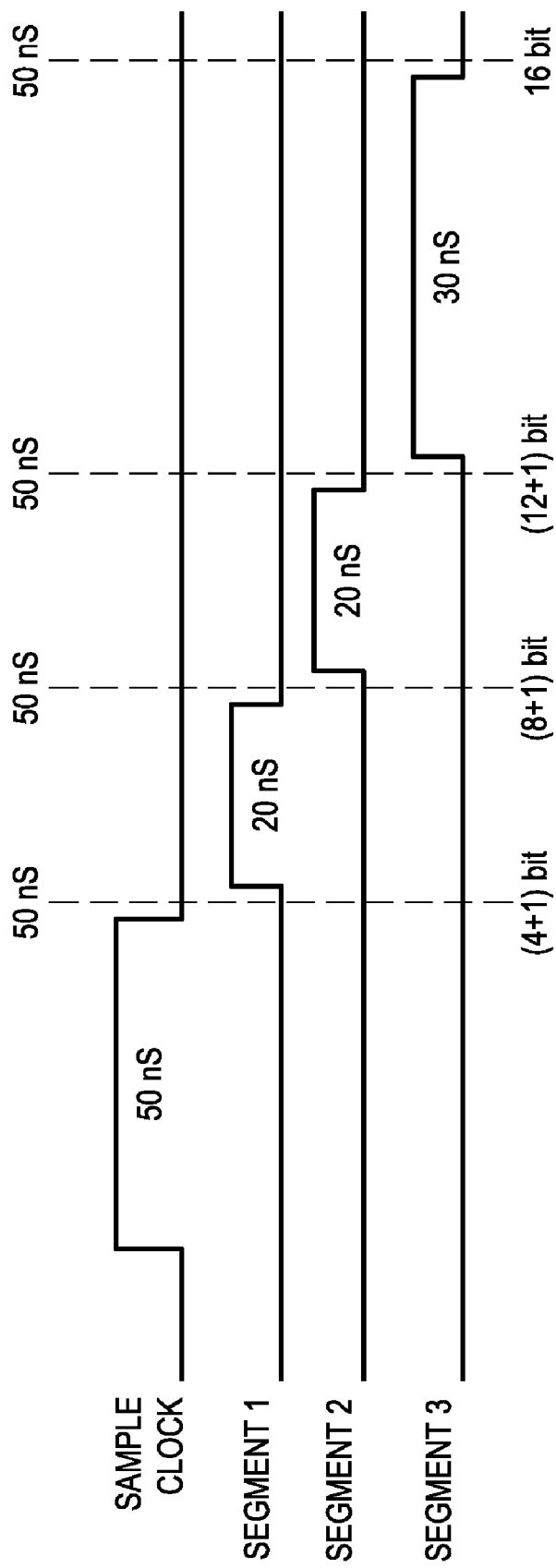
FIG. 3 is an example of a timing diagram for the circuit of FIG. 1.

In operation (which can be seen in FIG. 3), the ADC 100 is generally able to perform multi-stage resolution using a recyclic or recycling architecture. ADC 102 receives and analog input signal AIN and generates differential signals INP and INM. During a sampling phase, the signals INP and INM are sampled into their respective capacitor arrays 120-1, 120-2, 120-3, 122-1, 122-2, and 122-3 through their respective switch arrays 118-1, 118-2, 118-3, 124-1, 124-2, and 124-3 and into sampling flash 114. For example, this sampling phase can be, for example, from about 50 ns to about 100 ns long.

Once complete the sampling phase is complete, the ADC enters the conversion phase. Following the sampling phase, the first 4+1 (for example) bits are resolved by the sampling flash 114, and the remainder of the conversion phase generally occurs in three segments. During the first segment (which can be, for example, from about 20 ns to about 40 ns in length), the residue amplifier 106 applies feedback to the feedback capacitors CFB1 and CFB4 through feedback switches FSB1 and SFB4, and the SAR logic 112 applies the appropriate control signals to switch arrays 120-1 and 124-1 (to apply the reference voltages REFP and REFM) and feedback switches FSB1 and SFB4 (to apply the common mode voltage VCM) in accordance with a conventional SAR algorithm. This first segment resolves the next 4+1 (for example) bits. During the second segment (which can be, for example, from about 20 ns to about 40 ns in length), the residue amplifier 106 applies feedback to the feedback capacitors CFB2 and CFB5 through feedback switches FSB2 and SFB5, and the SAR logic 112 applies the appropriate control signals to switch arrays 120-2 and 124-2 (to apply the reference voltages REFP and REFM) and feedback switches FSB2 and SFB5 (to apply the common mode voltage VCM) in accordance with a conventional SAR algorithm. This second segment resolves the next 4+1 (for example) bits. During the third segment (which can be, for example, from about 30 ns to about 60 ns in length), the residue amplifier 106 applies feedback to the feedback capacitors CFB3 and CFB6 through feedback switches FSB3 and SFB3, and the SAR logic 112 applies the appropriate control signals to switch arrays 120-3 and 124-3 (to apply the reference voltages REFP and REFM) and feedback switches FSB3 and SFB6 (to apply the common mode voltage VCM) in accordance with a conventional SAR algorithm. This third segment resolves the next 4+1 (for example) bits. For each of the segments, too, the last bit resolved for the previous segment is retaken; thus, a total of 16 bits (for example) can be resolved. Additionally, ADC 100 can be arranged to have more or less bits resolved for each segment, and the total number of stages can be increased or decreased.

In a typical SAR ADC, a single bit is resolved through a comparator for every conversion clock cycle, but in ADC 100, the residue amplifier 106 resolved multiple bits for each conversion clock cycle. Designing the residue amplifier 106 to perform this function, though, includes taking in to consideration the closed loop gain changes, tolerable gain error, settling requirements, changing capacitive loads, and so forth.

Figure 2:
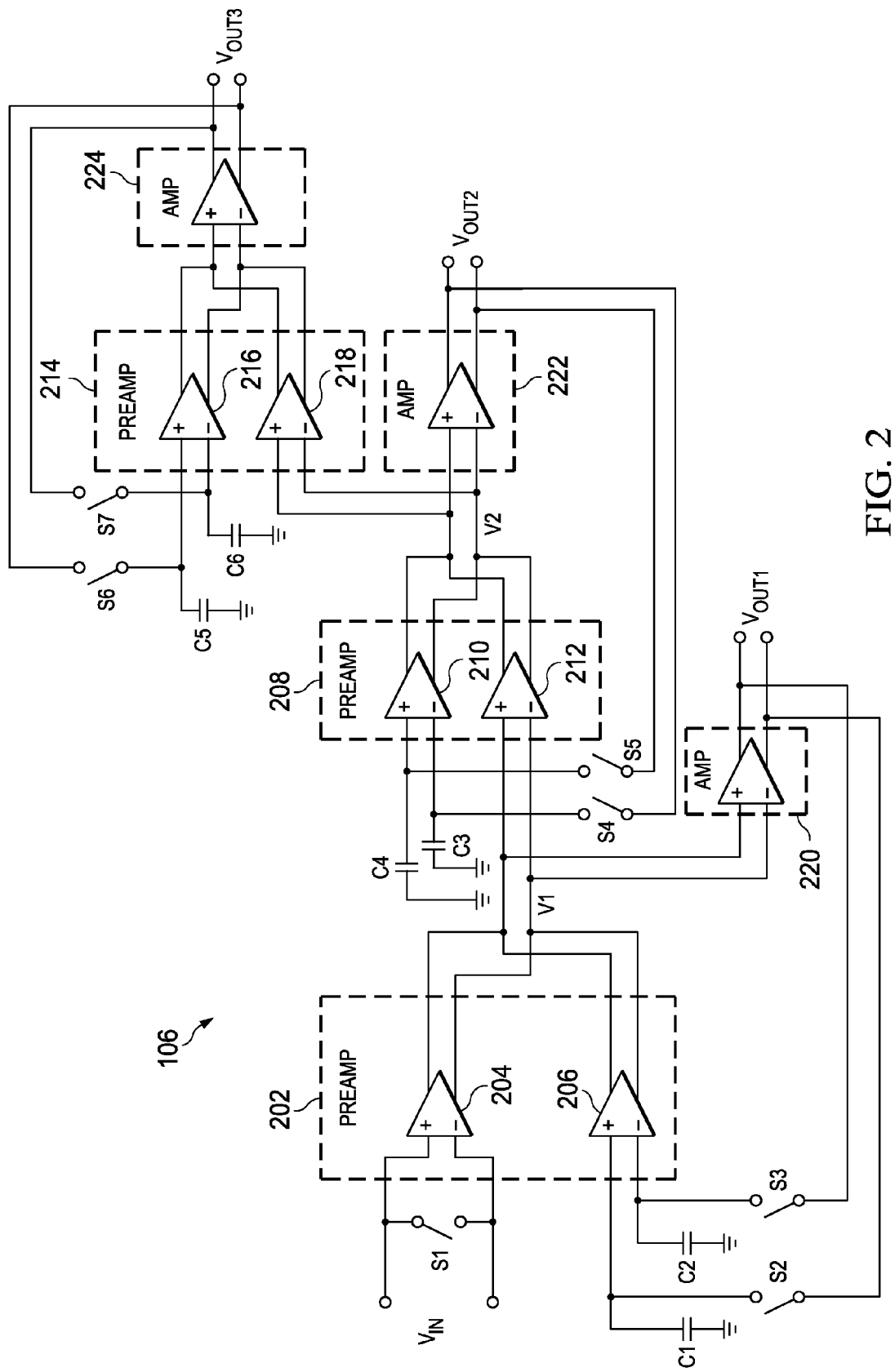
FIG. 2 is a circuit diagram of an example of the reside amplifier of FIG. 1.

Considering that it is very difficult to design an amplifier that performs well with very different requirements, residue amplifier 106, which is shown in more detail in FIG. 2, employs cascaded amplifier to perform as desired. Residue amplifier 106 generally comprises preamplifiers 202, 208, and 214, output amplifiers 220, 222, and 224, capacitors C1 through C6, and switches S1 through S7. These components operate to provide three feedback paths (for each segment).

Initially, however, the residue amplifier 106 can be auto-zeroed to generally eliminate offset components by adjusting the voltages stored at capacitors C1 through C6. During auto-zeroing, switches S1 through S7 are closed. Under these conditions, the voltages stored across capacitors C1 and C2 (VST1), capacitors C3 and C4 (VST2), and capacitors C4 and C5 (VST3) would be as follows:

$$VST1 = -\left(VOS1\frac{A1}{A2} + VOS2 + VOS3\frac{A3}{A2}\right); \quad (1)$$

$$VST2 = -\left(VOS1\frac{A1A4}{A5} + VOS2\frac{A2A4}{A5} + VST1\frac{A2A4}{A5} + \right. \quad (2)$$
$$\left. V1\frac{A4}{A5} + VOS4\frac{A4}{A5} + VOS5 + VOS6\frac{A6}{A5}\right);$$

and $$VST1 = \quad (3)$$
$$-\left(VOS7\frac{A7}{A8} + VOS8 + VOS9\frac{A9}{A8} + VOS4\frac{A4A7}{A8} + VOS5\frac{A5A7}{A8} + \right.$$
$$\left. VST2\frac{A5A7}{A8} + V2\frac{A7}{A8} + V1\frac{A4A7}{A8}\right),$$

where A1 through A9 are the gains of amplifiers 204, 206, 220, 212, 210, 222, 218, 216, and 224 (respectively), 204, 206, 220, 212, 210, 222, 218, 216, and 224 are the offset voltages of amplifiers 204, 206, 220, 212, 210, 222, 218, 216, and 224 (respectively), V1 is the output voltage of amplifier 304, and V2 is the output voltage of amplifier 212. Thus, when switches S1 through S7 are open and an input voltage VIN is applied to amplifier 204, the output voltages VOUT1, VOUT2, and VOUT3 will be as follows:

$$VOUT1=VIN_A1A3+VST1A2A3+VOS1A1A3+VOS2A2A3+VOS3A3; \quad (4)$$

$$VOUT2=VIN_A1A4A6+VOS1A1A4A6+VOS2A2A4A6+VST1A2A4A6+V1A4A6+Vos4A4A6+VOS5A5A6+VST2A5A6+VOS6A6; \quad (5)$$

and $$VOUT3=VIN_A1A4A7A9+VOS1A1A4A7A9+VOS2A2A4A7A9+VST1A2A4A7A9+VOS4A4A7A9+VOS5A5A7A9+VST2A4A7A9+VOS7A7A9+VOS8A8A9 VST3A8A9+VOS9A9. \quad (6)$$

Each of equations (4), (5), and (6) can then be reduced as follows because the offset voltages VOS1 through VOS9 for amplifiers 204, 206, 220, 212, 210, 222, 218, 216, and 224 are compensated for by the auto-zeroing:

$$VOUT1=VIN_A1A3; \quad (4)$$

$$VOUT2=VIN_A1A4A6; \quad (5)$$

and $$VOUT3=VIN_A1A4A7A9. \quad (6)$$

Thus, these output voltages VOUT1, VOUT2, and VOUT3 operate as feedback voltage for the DAC 104. Preamplifier 204, capacitors C1 and C2, and amplifier 220 preferably operate the feedback path for the first segment. Preamplifiers 204 and 208, capacitors C1 through C4, and amplifier 222 preferably operate as the feedback path for the second segment, and preamplifiers, 202, 208, and 214, capacitors C1 through C6, and amplifier 224 preferably operate as the feedback path for the third segment.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
  a first amplifier stage including:
    a first preamplifier having a plurality of input terminals and an output terminal, wherein at least one of the input terminals of the first preamplifier receives an input signal for the first amplifier stage;
    a first output amplifier having an input terminal and an output terminal, wherein the input terminal of the first output amplifier is coupled to the output terminal of the first preamplifier;
    a first switch that is coupled between the output terminal of the first output amplifier and at least one of the input terminals of the first preamplifier; and
    a first capacitor that is coupled to the first switch; and
  a second amplifier stage including:
    a second preamplifier having a plurality of input terminals and an output terminal, wherein at least one of the input terminals is coupled the output terminal of the first preamplifier stage;
    a second output amplifier having an input terminal and an output terminal, wherein the input terminal of the second output amplifier is coupled to the output terminal of the second preamplifier;
    a second switch that is coupled between the output terminal of the second output amplifier and at least one of the input terminals of the second preamplifier; and
    a second capacitor that is coupled to the second switch.

2. The apparatus of claim 1, wherein the apparatus further comprises a third stage including:
  a third preamplifier having a plurality of input terminals and an output terminal, wherein at least one of the input terminals is coupled the output terminal of the second preamplifier stage;
  a third output amplifier having an input terminal and an output terminal, wherein the input terminal of the third output amplifier is coupled to the output terminal of the third preamplifier;
  a third switch that is coupled between the output terminal of the third output amplifier and at least one of the input terminals of the third preamplifier; and
  a third capacitor that is coupled to the third switch.

3. The apparatus of claim 1, wherein the first preamplifier further comprises a pair of amplifiers, wherein each amplifier from the pair includes a pair of differential input terminals and a pair of differential output terminals.

4. The apparatus of claim 1, wherein the second preamplifier further comprises a pair of amplifiers, wherein each amplifier from the pair includes a pair of differential input terminals and a pair of differential output terminals.

5. The apparatus of claim 1, wherein each of the first and second output terminals includes a pair of differential input terminals and a pair of differential output terminals.

6. An apparatus comprising:
  a first amplifier having a first input terminal, a second input terminal, a first output terminal, and a second output terminal, wherein the first and second input terminals of the first amplifier receive an input signal;
  a second amplifier having a first input terminal, a second input terminal, a first output terminal, and a second output terminal, wherein the first output terminal of the second amplifier is coupled to the first output terminal of the first amplifier, and wherein the second output terminal of the second amplifier is coupled to the second output terminal of the first amplifier;
  a third amplifier having a first input terminal, a second input terminal, a first output terminal, and a second output terminal, wherein the first input terminal of the third amplifier is coupled to the first output terminal of the first amplifier, and wherein the second input terminal of the third amplifier is coupled to the second output terminal of the first amplifier;
  a first switch that is coupled between the first output terminal of the third amplifier and the first input terminal of the second amplifier;
  a second switch that is coupled between the second output terminal of the third amplifier and the second input terminal of the second amplifier;
  a fourth amplifier having a first input terminal, a second input terminal, a first output terminal, and a second output terminal, wherein the first input terminal of the fourth amplifier is coupled to the first output terminal of the first amplifier, and the second input terminal of the fourth amplifier is coupled to the second output terminal of the first amplifier;
  a fifth amplifier having a first input terminal, a second input terminal, a first output terminal, and a second output terminal, wherein first output terminal of the fifth amplifier is coupled to the first output terminal of the fourth amplifier, and wherein the second output terminal of the fifth amplifier is coupled to the second output terminal of fourth amplifier;

a sixth amplifier having a first input terminal, a second input terminal, a first output terminal, and a second output terminal, wherein the first input terminal of the sixth amplifier is coupled to the first output terminal of the fourth amplifier, and wherein the second input terminal of the sixth amplifier is coupled to the second output terminal of the fourth amplifier;

a third switch that is coupled between the first output terminal of the sixth amplifier and the first input terminal of the fifth amplifier; and a fourth switch that is coupled between the second output terminal of the and the second input terminal of the fifth amplifier.

7. The apparatus of claim 6, wherein the apparatus further comprises:

a seventh amplifier having a first input terminal, a second input terminal, a first output terminal, and a second output terminal, wherein the first input terminal of the seventh amplifier is coupled to the first output terminal of the first amplifier, and the second input terminal of the seventh amplifier is coupled to the second output terminal of the first amplifier;

a eighth amplifier having a first input terminal, a second input terminal, a first output terminal, and a second output terminal, wherein first output terminal of the eighth amplifier is coupled to the first output terminal of the seventh amplifier, and wherein the second output terminal of the eighth amplifier is coupled to the second output terminal of seventh amplifier;

a ninth amplifier having a first input terminal, a second input terminal, a first output terminal, and a second output terminal, wherein the first input terminal of the ninth amplifier is coupled to the first output terminal of the seventh amplifier, and wherein the second input terminal of the ninth amplifier is coupled to the second output terminal of the seventh amplifier;

a fifth switch that is coupled between the first output terminal of the ninth amplifier and the first input terminal of the eighth amplifier; and a sixth switch that is coupled between the second output terminal of the and the second input terminal of the eighth amplifier.

8. The apparatus of claim 6, wherein the apparatus further comprises a fifth switch that is coupled between the first and second input terminals of the first amplifier.

9. The apparatus of claim 6, wherein the apparatus further comprises:

a first capacitor that is coupled between the first input terminal of the second amplifier and ground;

a second capacitor that is coupled between the second input terminal of the second amplifier and ground;

a third capacitor that is coupled between the first input terminal of the fifth amplifier and ground; and a fourth capacitor that is coupled between the second input terminal of the fifth amplifier and ground.

10. An successive approximate register (SAR) analog-to-digital converter (ADC) comprising:

an ADC;

a DAC that is coupled to the ADC;

a residue amplifier including:

a first preamplifier having a plurality of input terminals and an output terminal, wherein at least one of the input terminals of the first preamplifier is coupled to the DAC;

a first output amplifier having an input terminal and an output terminal, wherein the input terminal of the first output amplifier is coupled to the output terminal of the first preamplifier;

a first switch that is coupled between the output terminal of the first output amplifier and at least one of the input terminals of the first preamplifier; and a first capacitor that is coupled to the first switch; and a second preamplifier having a plurality of input terminals and an output terminal, wherein at least one of the input terminals is coupled the output terminal of the first preamplifier stage;

a second output amplifier having an input terminal and an output terminal, wherein the input terminal of the second output amplifier is coupled to the output terminal of the second preamplifier;

a second switch that is coupled between the output terminal of the second output amplifier and at least one of the input terminals of the second preamplifier; and a second capacitor that is coupled to the second switch; and SAR logic that is coupled to the residue amplifier and to the DAC.

11. The SAR ADC of claim 10, wherein the SAR ADC stage further comprises a conversion flash circuit coupled between the residue amplifier and the SAR logic.

12. The SAR ADC of claim 10, wherein the residue amplifier further comprises:

a third preamplifier having a plurality of input terminals and an output terminal, wherein at least one of the input terminals is coupled the output terminal of the second preamplifier stage;

a third output amplifier having an input terminal and an output terminal, wherein the input terminal of the third output amplifier is coupled to the output terminal of the third preamplifier;

a third switch that is coupled between the output terminal of the third output amplifier and at least one of the input terminals of the third preamplifier; and a third capacitor that is coupled to the third switch.

13. The SAR ADC of claim 10, wherein each of the first and second output amplifier further comprises a first input terminal, a second input terminal, a first output terminal, and a second output terminal, and wherein the first switch further comprises a pair of first switches, and wherein the second switch further comprises a pair of second switches, and wherein the first capacitor further comprises a pair of first capacitors, and wherein the second capacitor further comprises a pair of second capacitors.

14. The SAR ADC of claim 13, wherein the first preamplifier further comprises:

a first amplifier having a first input terminal, a second input terminal, a first output terminal, and a second output terminal, wherein the first and second input terminals of the first amplifier receive an input signal; and a second amplifier having a first input terminal, a second input terminal, a first output terminal, and a second output terminal, wherein the first output terminal of the second amplifier is coupled to the first output terminal of the first amplifier, and wherein the second output terminal of the second amplifier is coupled to the second output terminal of the first amplifier, and wherein each of the first and second input terminals of the second amplifier is coupled to at least one of the pair of first switches.

15. The SAR ADC of claim 14, wherein the second preamplifier further comprises:

a third amplifier having a first input terminal, a second input terminal, a first output terminal, and a second output terminal, wherein the first input terminal of the third amplifier is coupled to the first output terminal of the first amplifier, and the second input terminal of the third amplifier is coupled to the second output terminal of the first amplifier; and a fourth amplifier having a first input terminal, a second input terminal, a first output terminal, and a second output terminal, wherein first output terminal of the fourth amplifier is coupled to the first output terminal of the third amplifier, and wherein the second output terminal of the fourth amplifier is coupled to the second output terminal of third amplifier, and wherein each of the first and second input terminals of the fourth amplifier is coupled to at least one of the pair of second switches.

16. The SAR ADC of claim 10, wherein the DAC further comprises:

a set of resolution capacitors, wherein each resolution capacitor from the first set of resolution capacitors is coupled to first preamplifier;

a set of resolution switches, wherein each resolution switch is coupled to the ADC, receives a reference voltage, and is coupled to at least one of the resolution capacitors;

a set of feedback capacitors, wherein each feedback capacitor is coupled to the first preamplifier;

a set of feedback switches, wherein each feedback switch is coupled to the residue amplifier, receives a common mode voltage, and is coupled to at least one of the feedback capacitors.

17. The SAR ADC of claim 10, wherein the SAR ADC further comprises a sample flash circuit that is coupled between the ADC and SAR logic.

* * * * *